(12) United States Patent
Yeh

(10) Patent No.: US 8,046,603 B2
(45) Date of Patent: Oct. 25, 2011

(54) NETWORK REAL-TIME ELECTRICITY MONITORING SYSTEM

(75) Inventor: Shiann-Chang Yeh, Taipei Hsien (TW)

(73) Assignee: Acbel Polytech Inc.

( * ) Notice: Subject to any disclaimer, the term of this patent is extended or adjusted under 35 U.S.C. 154(b) by 912 days.

(21) Appl. No.: 12/037,576

(22) Filed: Feb. 26, 2008

(65) Prior Publication Data

US 2009/0070616 A1 Mar. 12, 2009

(30) Foreign Application Priority Data

Sep. 7, 2007 (TW) ................ 96133436 A

(51) Int. Cl.
*G06F 1/00* (2006.01)
*G06F 11/30* (2006.01)
(52) U.S. Cl. .................................................. 713/300
(58) Field of Classification Search .......... 713/300, 713/340
See application file for complete search history.

(56) References Cited

U.S. PATENT DOCUMENTS

| 6,383,076 B1* | 5/2002 | Tiedeken ............... 463/40 |
| 6,995,658 B2* | 2/2006 | Tustison et al. ........ 375/219 |
| 7,050,831 B2* | 5/2006 | Meiksin et al. ........ 455/560 |
| 2004/0177283 A1* | 9/2004 | Madany et al. ........ 713/300 |
| 2004/0212343 A1* | 10/2004 | Sakai ................. 320/111 |

* cited by examiner

*Primary Examiner* — Mohammed Rehman
(74) *Attorney, Agent, or Firm* — Hershkovitz & Associates LLC; Abraham Hershkovitz

(57) ABSTRACT

A network real-time electricity monitoring system has at least one power line communicating and AC power monitoring device, a power line network device and a monitoring computer. The power line communicating and AC power monitoring device is connected to a power line of a corresponding target device to retrieve and transform statuses of an AC power in the power line into network packets and sends the network packets out through the power line. The power line network device is connected to the power line to retrieve the network packets and sends the network packets to a local monitoring computer or a remote monitoring computer based on Internet protocol address of the monitoring computer installed in the power line network device.

9 Claims, 6 Drawing Sheets

NETWORK REAL-TIME ELECTRICITY MONITORING SYSTEM

BACKGROUND OF THE INVENTION

1. Field of the Invention

The present invention relates to an electricity monitoring system, and more particularly to a network real-time electricity monitoring system.

2. Description of Related Art

Manufacturers cannot monitor statuses of the power consumption of the electric appliances that are used in users' places. The users send the electric appliances back to the manufacturer once the electric appliance has failure. The manufacturer then checks if the failure of the electric appliance is resulted from inside of the electric appliance or from the improper usage. Therefore, the manufacturers cannot actually realize how the users operate the electric appliances.

In addition, more people choose to live in buildings because the population increases. However, electric power consumption of public areas in a building is not easy to be divided equally to each inhabitant in the building. Therefore, it is a thorny problem to manage the power usage in the buildings.

To overcome the shortcomings, the present invention provides a network real-time electricity monitoring system to mitigate or obviate the aforementioned problems.

SUMMARY OF THE INVENTION

The main objective of the invention is to provide a network real-time electricity monitoring system.

The network real-time electricity monitoring system in accordance with the present invention comprises at least one power line communicating and AC power monitoring device, a power line network device and a monitoring computer. The power line communicating and AC power monitoring device is coupled to a power line of a target electric appliance to retrieve and transform statuses of an AC power in the power line into network packets and sends the network packets out through the power line. The power line network device is connected to the power line to retrieve the network packets and sends the network packets to the monitoring computer. Therefore, the monitoring computer monitors operation of the electric appliance.

The other objective of the invention is to provide a real-time monitoring system that provides an electricity remotely multi-monitoring function. The present invention further comprises a network connecting device when the monitoring computer is away from the monitoring target. The network connecting device sends the network packets to the Internet so the remote monitoring computer can retrieve the network packets over the Internet to monitor operations of multiple electric appliances.

Other objectives, advantages and novel features of the invention will become more apparent from the following detailed description when taken in conjunction with the accompanying drawings.

DETAILED DESCRIPTION OF PREFERRED EMBODIMENT

Figure 1:
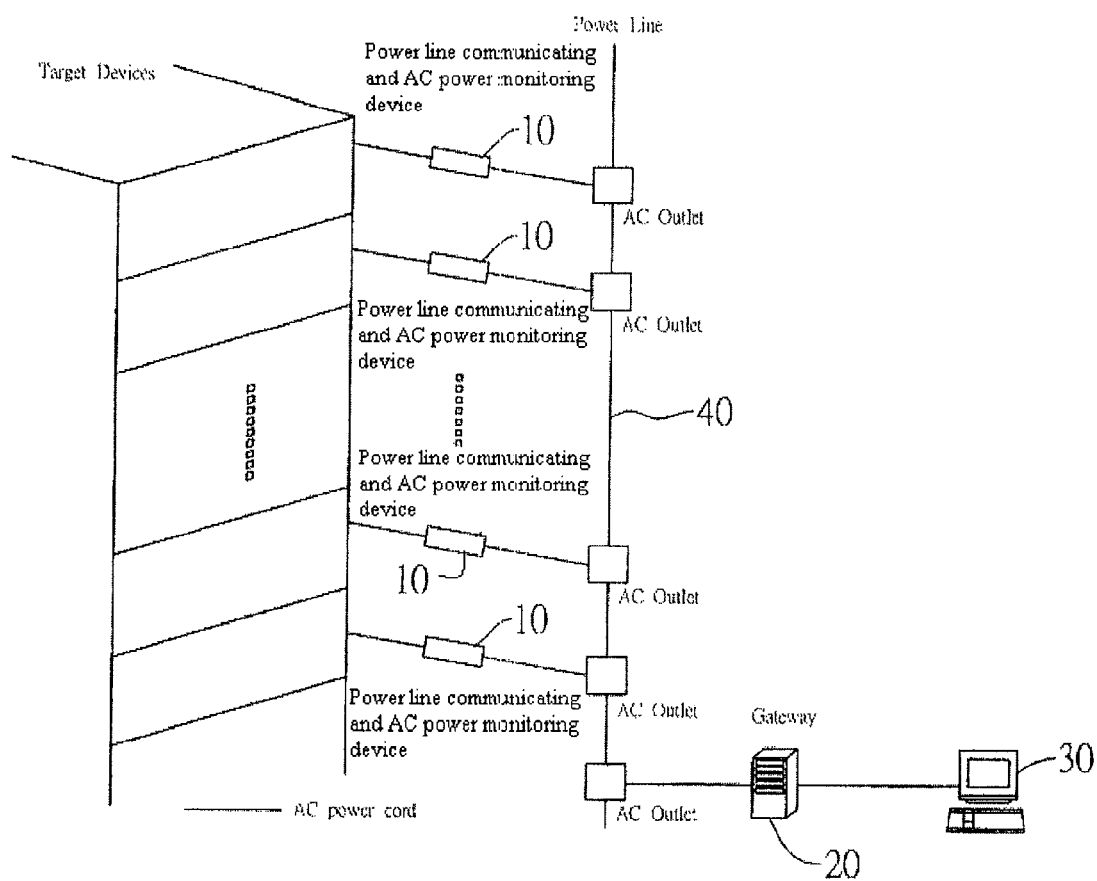
FIG. 1 is a functional block diagram of a first embodiment of a network real-time electricity monitoring system in accordance with the present invention.

With reference to FIG. 1, a first embodiment of a network real-time electricity monitoring system in accordance with the present invention comprises at least one power line communicating and AC power monitoring device (10), a power line network device (20) and a monitoring computer (30).

The at least one power line communicating and AC power monitoring device (10) senses power status from an AC power in a power line (40), transforms the power status into network packets and modulates the network packets to be coupled into the AC power, so as to transmit the network packets through the power line (40).

The power line network device (20) is electronically connected to the power line (40) carrying the AC power with the network packets, retrieves the network packets in the AC power and sends the network packets to a network.

Figure 2:
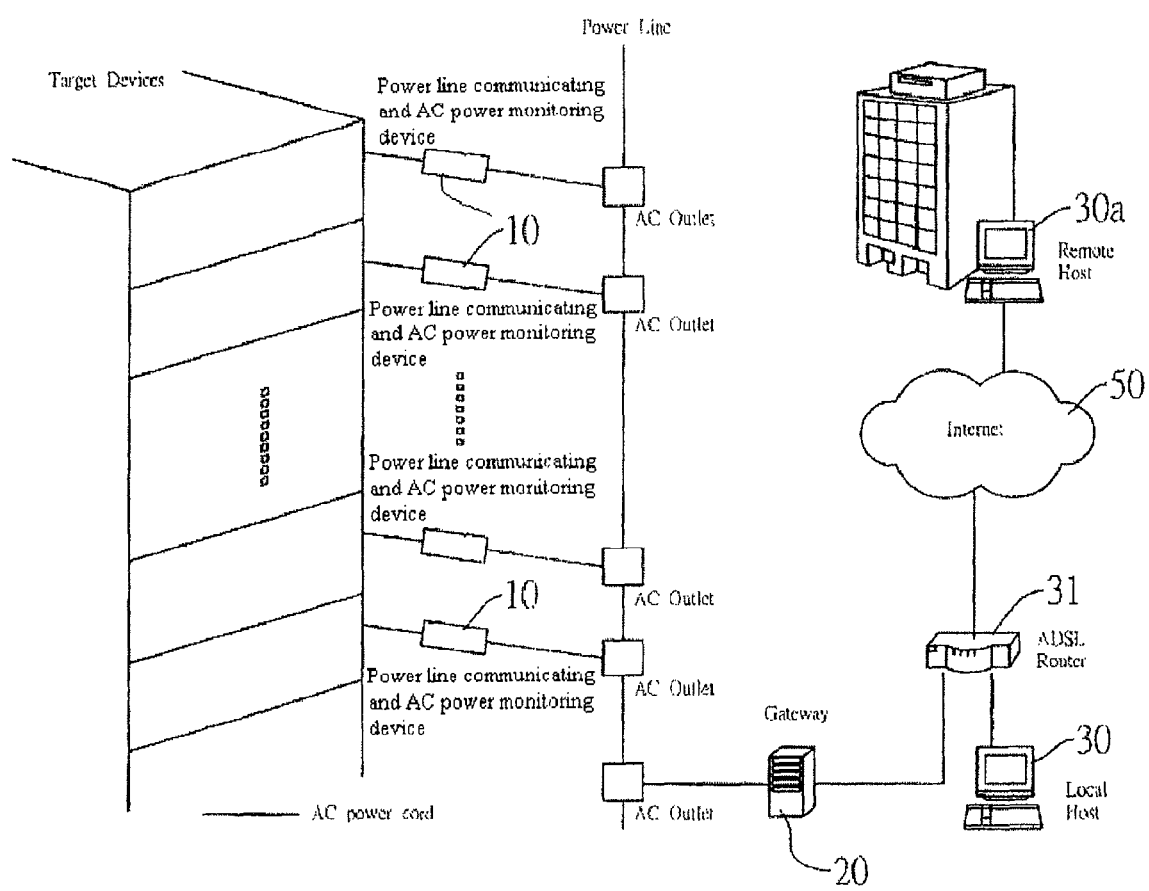
FIG. 2 is a functional block diagram of a second embodiment of a network real-time electricity monitoring system in accordance with the present invention.

The monitoring computer (30) is electronically connected to the power line network device (20) over the network to retrieve the network packets from the AC power. Since the network packets include the power status, the monitoring computer (30) extracts or/and stores the power status from the network packets. In the first embodiment, the monitoring computer (30) is a local monitoring computer connected directly to the power line network device (20). With further reference to FIG. 2, a second embodiment of the system in accordance with the present invention further comprises a network connecting device (31) (ex: ADSL router) and the monitoring computer (30) is a remote monitoring computer (30a). The network connecting device (31) is connected between the Internet (50) and the power line network device (20). Furthermore, the power line network device (20) stores an Internet protocol (IP) address of the remote monitoring computer (30a) so the power line network device (20) sends the network packets in the power line (40) to the network connecting device (31) and the network connecting device (31) processes and transmits the network packets to the Internet (50). Therefore, the remote monitoring computer (30) retrieves the network packets so a remote real-time monitoring effect is achieved.

Figure 3:
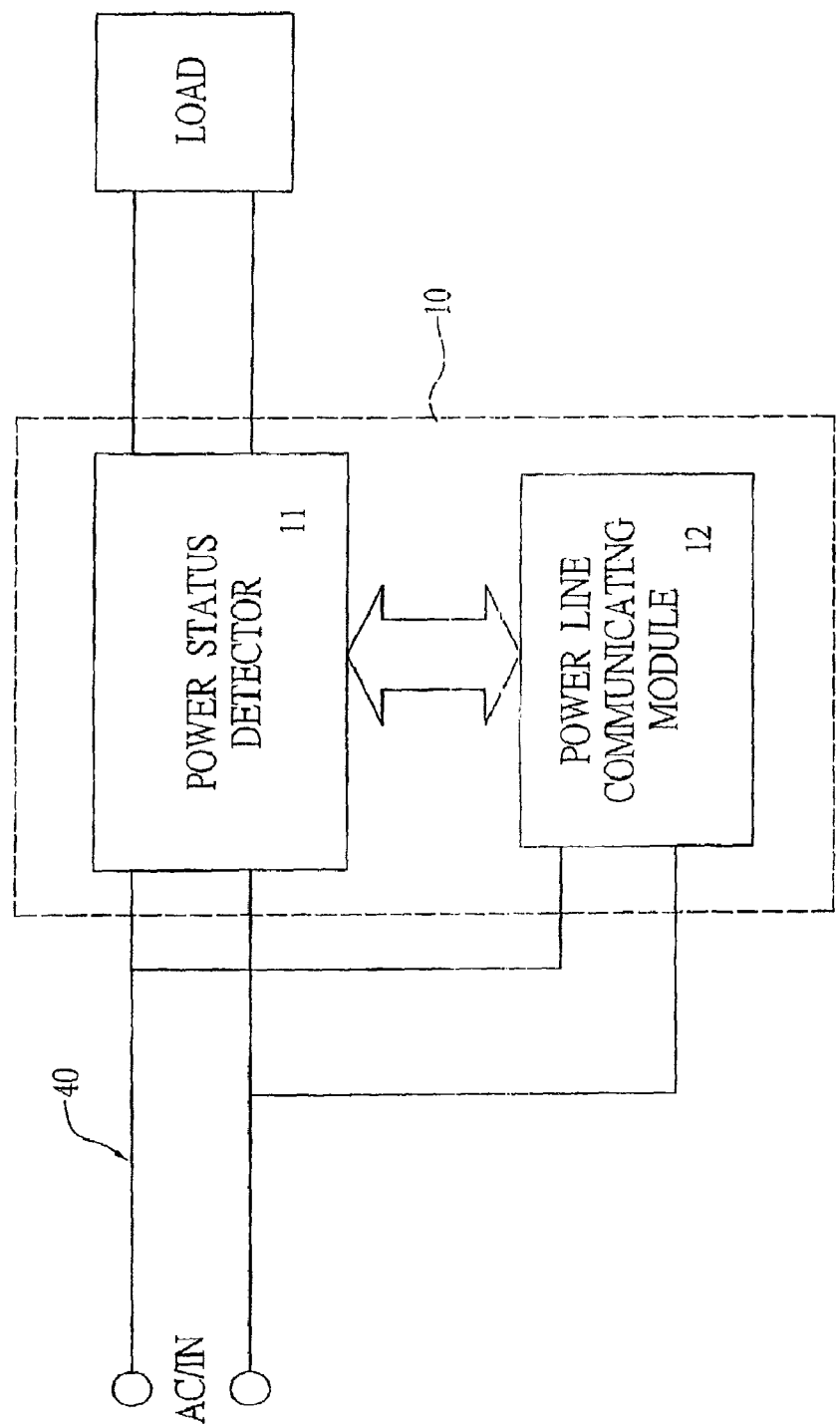
FIG. 3 is a functional block diagram of a power line communicating and AC power monitoring device in the network real-time electricity monitoring system.

With reference to FIG. 3, the power line communicating and AC power monitoring device (10) further comprises a power status detector (11) and a power line communicating module (12).

The power status detector (11) is electronically connected to the power line (40) carrying the AC power with the network packets to detect a power using status of the AC power in the power line (40), transforms analog signals of the power using status of the AC power into digitized power status data (including a voltage status signal, a current status signal or a power status signal) and outputs the power status data.

The power line communicating module (12) is electronically connected between an output terminal of the power status detector (11) and the power line (40) to transform the digitized power status data into the network packets and couple the network packets into the AC power in the power line (40).

Figure 4:
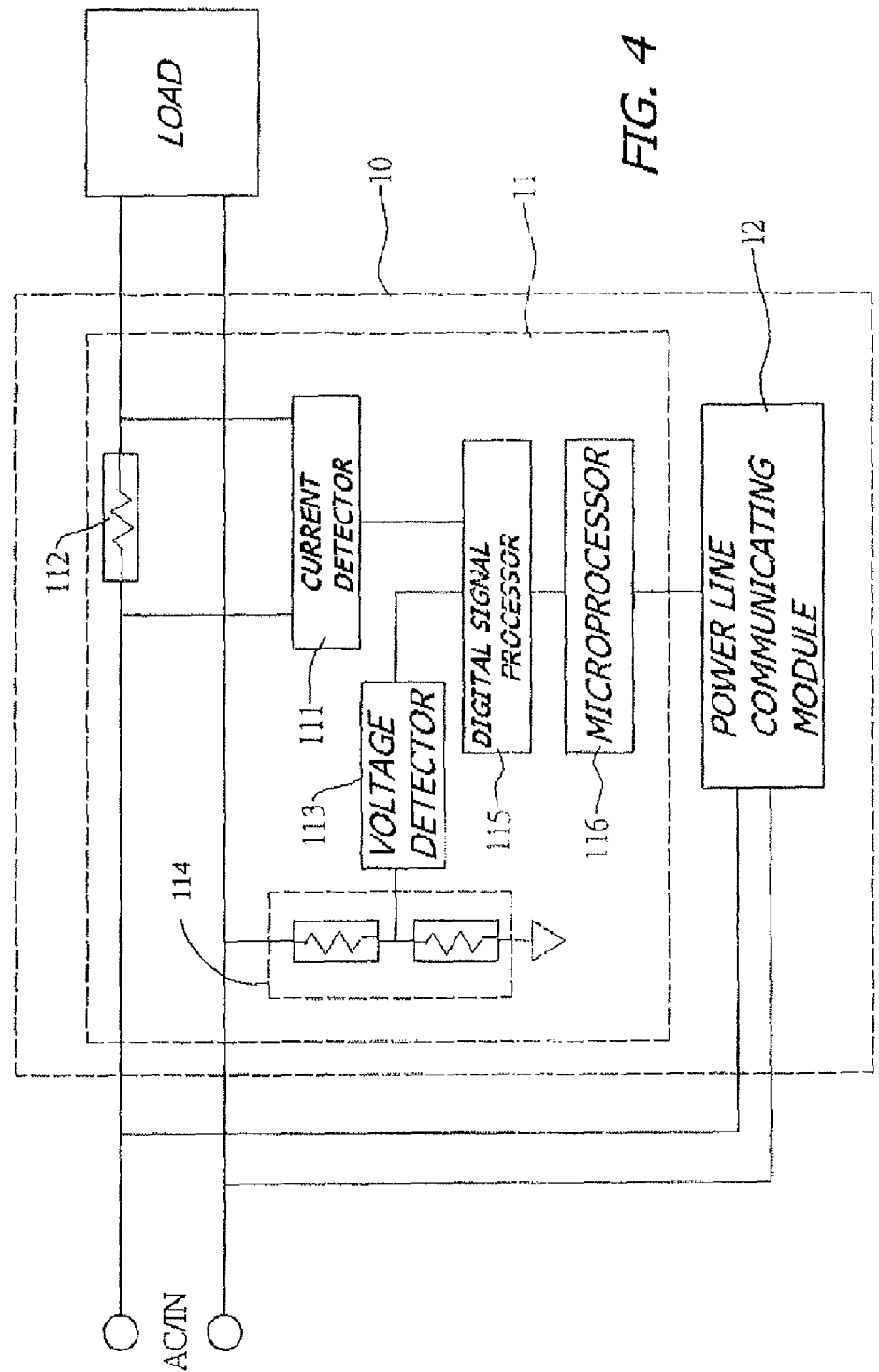
FIG. 4 is a functional block diagram of a power status detector in the power line communicating and AC power monitoring device in FIG. 3.

With reference to FIG. 4, the power status detector (11) further comprises a current detector (111), a voltage detector (113) and a processing unit.

The current detector (111) is connected to the power line (40) through a resistor (112) in series to detect current signals of the AC power in the power line (40) and transform the current signals into digitized current signals.

The voltage detector (113) is connected between the power line (40) and ground through a voltage divider (114) to detect voltage signals of the AC power in the power line (40) and transform the voltage signals into digitized voltage signals.

The processing unit is electronically connected between the current and the voltage detectors (111, 113) and the power line communicating module (12) to retrieve the digitized current and voltage signals and calculates and outputs current, voltage or power status data. Furthermore, the processing unit comprises a digital signal processor (115) and a microprocessor (116). The digital signal processor (15) is electronically connected to output terminals of the current and voltage detectors (111, 113) to retrieve the digitized current and voltage signals, processes a high-speed calculation and sends a result of the calculation to the power line network device (20) through the microprocessor (116).

Figure 5:
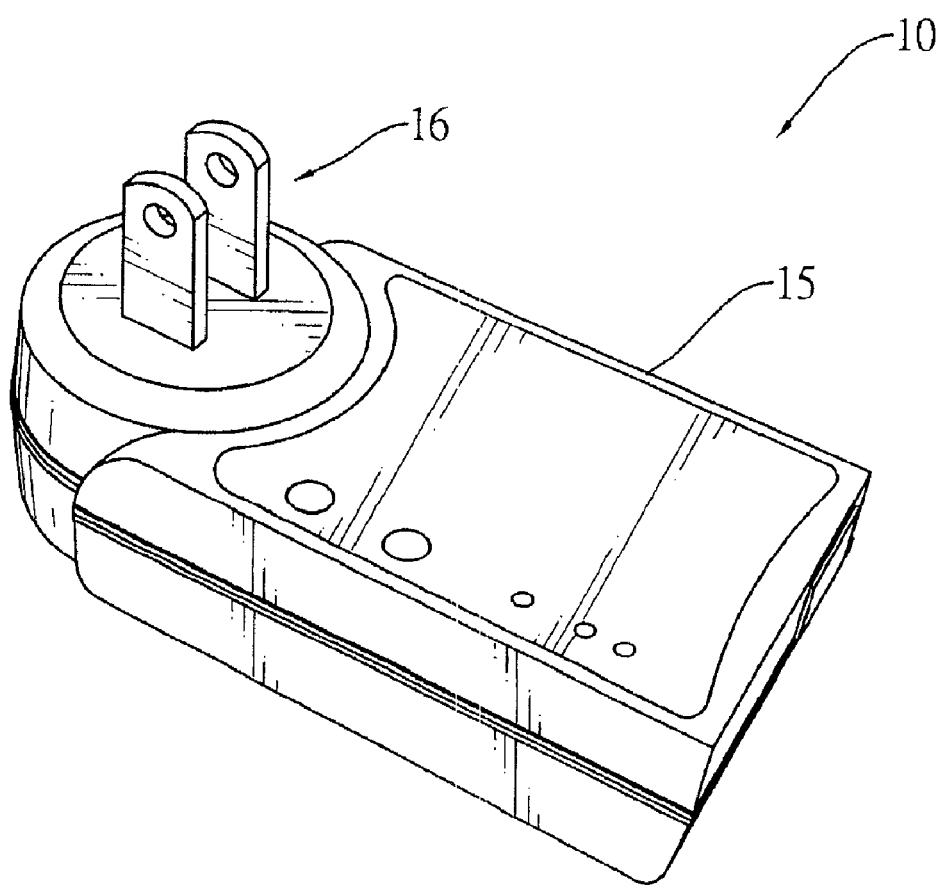
FIG. 5 is a perspective view of a first embodiment of a power line communicating and AC power monitoring device in the network real-time electricity monitoring system.
Figure 6:
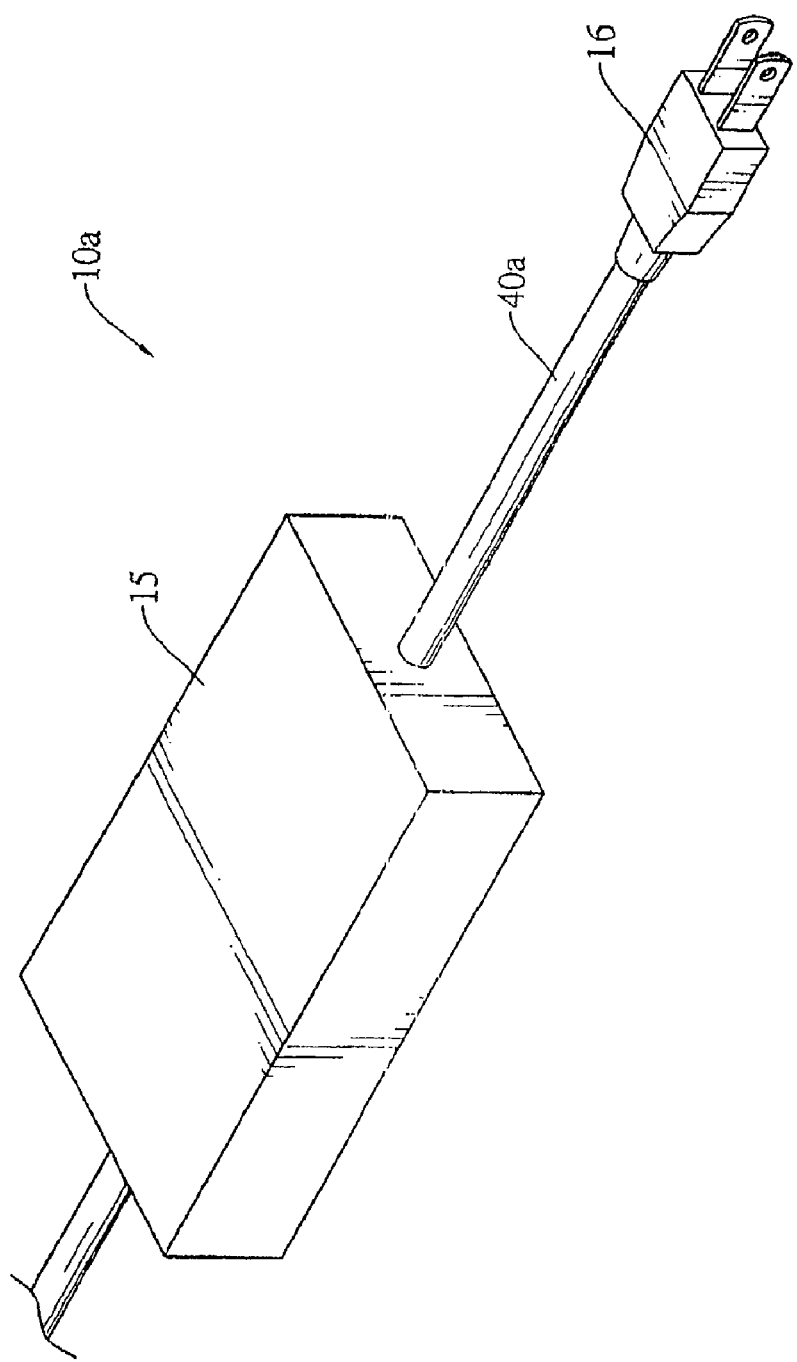
FIG. 6 is a perspective view of a second embodiment of a power line communicating and AC power monitoring device in the network real-time electricity monitoring system.

In addition, with further reference to FIG. 5, a perspective view of the power line communicating and AC power monitoring device (10) is shown. The power line communicating and AC power monitoring device (10) further has a casing (15) and a plug (16). The casing (15) encases the mentioned elements of the power line communicating and AC power monitoring device (10). The plug (16) is formed on the casing (15) and is electronically connected to the power line communicating and AC power monitoring device (10). With further reference to FIG. 6, the power line communicating and AC power monitoring device (10a) further has a casing (15), a power line (40a) and an AC plug (16). The casing (15) encases the mentioned elements of the power line communicating and AC power monitoring device (10). An end of the power line (40a) is formed on the casing (15). The AC plug (16) is disposed on another end of the power line (40a) so the AC plug (16) is electrically connected to the power line communicating and AC power monitoring device (10).

Based on the foregoing description, the power line communicating and AC power monitoring device (10) is connected to the power line (40) directly at or near target devices to allow the power status detector (11) to detect status of the AC power in the power line (40). Because the power status detector (11) outputs analog signals so the analog signals are converted into digitized signals by an analog to digital converter and are sent to the processing unit. The processing unit processes and outputs the digitized power status data to the power line communicating module (12) so the power line communicating module (12) transforms the digitized power status data into the network packets and couple the network packets into the AC power in the power line (40) to treat the power line (40) as a medium for transmitting the network packets.

With further reference to FIG. 1, the power line network device (20) receives the AC power from the power line (40), retrieves the network packets in the AC power and sends the network packets to the monitoring computer (30) through the network. Therefore, the monitoring computer (30) can process real-time electricity monitoring to the target devices.

With further reference to FIG. 2, the remote monitoring computer (30a) can process remotely real-time electricity monitoring to the target devices because the power line network device (20) connects to the Internet through the network connecting device (31) to allow the remote monitoring computer (30a) obtain the power using status of the target devices disposed in the local. For example, the industrial server manufacturer can monitor power statuses of industrial servers located in different places.

Even though numerous characteristics and advantages of the present invention have been set forth in the foregoing description, together with details of the structure and function of the invention, the disclosure is illustrative only. Changes may be made in detail, especially in matters of shape, and arrangement of parts within the principles of the invention to the full extent indicated by the broad general meaning of the terms in which the appended claims are expressed.

What is claimed is:

1. A network real-time electricity monitoring system comprising:
    at least one power line communicating and AC power monitoring device sensing power status from an AC power in a power line, transforming the power status into network packets and modulating the network packets to be coupled into the AC power to transmit the network packets through the power line so as to transmit the network packets through the power line, wherein the power line communicating and AC power monitoring device comprises:
        a power status detector electronically connected to the power line carrying the AC power with the network packets to detect signals of the AC power in the power line, transforming the signals of the AC power into digitized power signals and outputting the digitized power signals; and
        a power line communicating module electronically connected to a processing unit of the power status detector to electronically connect to one power line, transforming the digitized power signals into the network packets and coupling the network packets into the AC power in the power line;
    a power line network device electronically connected to the power line carrying the AC power with the network packets, retrieving the network packets in the AC power and sending the network packets to a network; and
    a monitoring computer electronically connected to the power line network device over the network to retrieve the network packets from the AC power and extract the power status from the network packets.

2. The system as claimed in claim 1, wherein the power status detector comprises:
    a current detector connected to the power line through a resistor in series to detect current signals of the AC power in the power line;
    a voltage detector connected between the power line and ground through a voltage divider to detect voltage signals of the AC power in the power line; and
    the processing unit connected between the current and the voltage detectors and the power line communicating module to retrieve the digitized current and voltage signals and calculate and output current, voltage or power status data.

3. The system as claimed in claim 2, wherein the processing unit in the power status detector comprises:
    a digital signal processor electronically connected to output terminals of the current and voltage detectors to retrieve the digitized current and voltage signals, processing a calculation and outputting a result of the calculation; and a microprocessor electronically connected between an output terminal of the digital signal processor and the power line network device to output the result of the calculation from the digital signal processor.

4. A power line communicating and AC power monitoring device comprising:

a casing;

an AC plug mounted on an outside of the casing to connect to a power line;

a power status detector mounted in the casing, connected to the AC plug to retrieve signals of an AC power in the power line, transforming the signals of the AC power into digitized power signals and outputting the digitized power signals, wherein the power status detector comprises:

a current detector connected to the power line through a resistor in series to detect current signals of the AC power in the power line;

a voltage detector connected between the power line and ground through a voltage divider to detect voltage signals of the AC power in the power line; and a processing unit connected between the current and the voltage detectors to retrieve the digitized current and voltage signals and calculate and output current, voltage or power status data; and a power line communicating module mounted in the casing, electronically connected between the processing unit of the power status detector and the AC plug to transform the digitized power signals from the power status detector into network packets and coupling the network packets into the AC power in the power line.

5. The device as claimed in claim 4, wherein the processing unit in the power status detector comprises:

a digital signal processor electronically connected to output terminals of the current and voltage detectors to retrieve the digitized current and voltage signals, processing a calculation and outputting a result of the calculation; and a microprocessor electronically connected between an output terminal of the digital signal processor and the power line network device to output the result of the calculation from the digital signal processor.

6. The device as claimed in claim 5, wherein the AC plug is formed on the casing.

7. The device as claimed in claim 5, wherein the AC plug is disposed on an end of the power line.

8. The device as claimed in claim 4, wherein the AC plug is formed on the casing.

9. The device as claimed in claim 4, wherein the AC plug is disposed on an end of the power line.

* * * * *